United States Patent
Lin et al.

(10) Patent No.: US 11,715,731 B2
(45) Date of Patent: Aug. 1, 2023

(54) PACKAGE STRUCTURE AND METHOD OF FORMING THE SAME

(71) Applicant: Taiwan Semiconductor Manufacturing Company, Ltd., Hsinchu (TW)

(72) Inventors: Po-Yao Lin, Hsinchu County (TW); Shu-Shen Yeh, Taoyuan (TW); Chin-Hua Wang, New Taipei (TW); Yu-Sheng Lin, Hsinchu County (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 137 days.

(21) Appl. No.: 17/460,302

(22) Filed: Aug. 29, 2021

(65) Prior Publication Data
US 2023/0067349 A1     Mar. 2, 2023

(51) Int. Cl.
| H01L 25/18 | (2023.01) |
| H01L 23/498 | (2006.01) |
| H01L 25/00 | (2006.01) |
| H01L 23/31 | (2006.01) |
| H01L 23/48 | (2006.01) |

(52) U.S. Cl.
CPC .......... *H01L 25/18* (2013.01); *H01L 23/3128* (2013.01); *H01L 23/481* (2013.01); *H01L 23/49822* (2013.01); *H01L 25/50* (2013.01)

(58) Field of Classification Search
CPC .... H01L 25/18; H01L 23/481; H01L 23/3128
See application file for complete search history.

(56) References Cited

U.S. PATENT DOCUMENTS

| 9,000,584 | B2 | 4/2015 | Lin et al. |
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |

(Continued)

FOREIGN PATENT DOCUMENTS

| TW | 202115836 | 4/2021 |
| TW | 202117942 | 5/2021 |
| TW | 202117952 | 5/2021 |

OTHER PUBLICATIONS

"Office Action of Taiwan Counterpart Application", dated Nov. 8, 2022, p1-p8.

*Primary Examiner* — Thao P Le
(74) *Attorney, Agent, or Firm* — JCIPRNET

(57) ABSTRACT

Provided are a package structure and a method of forming the same. The package structure includes a first tier, a second tier, and a third tier. The first tier includes an interposer. The second tier is disposed on the first tier and includes a bottom die. The third tier is disposed on the second tier and includes a plurality of first dies and at least one second die. The at least one second die is disposed between the plurality of first dies. The plurality of first dies are electrically connected to the bottom die by a plurality of first connectors to form a signal path, the plurality of first dies are electrically connected to the interposer by a plurality of second connectors to form a power path, and the plurality of first connectors are closer to the at least one second die than the plurality of second connectors.

20 Claims, 13 Drawing Sheets

(56) References Cited

U.S. PATENT DOCUMENTS

| | | |
|---|---|---|
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2017/0005072 A1* | 1/2017 | Wei .................. H01L 25/50 |
| 2018/0114704 A1* | 4/2018 | Wang ............... H01L 23/5384 |
| 2019/0006339 A1* | 1/2019 | Lau ................. H01L 23/3675 |
| 2021/0098381 A1* | 4/2021 | Yu ..................... H01L 24/18 |
| 2022/0199604 A1* | 6/2022 | Klein ............... H01L 23/481 |
| 2022/0344287 A1* | 10/2022 | Yu .................... H01L 23/5386 |
| 2022/0375918 A1* | 11/2022 | Chiu ................. H01L 25/50 |

* cited by examiner

PACKAGE STRUCTURE AND METHOD OF FORMING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
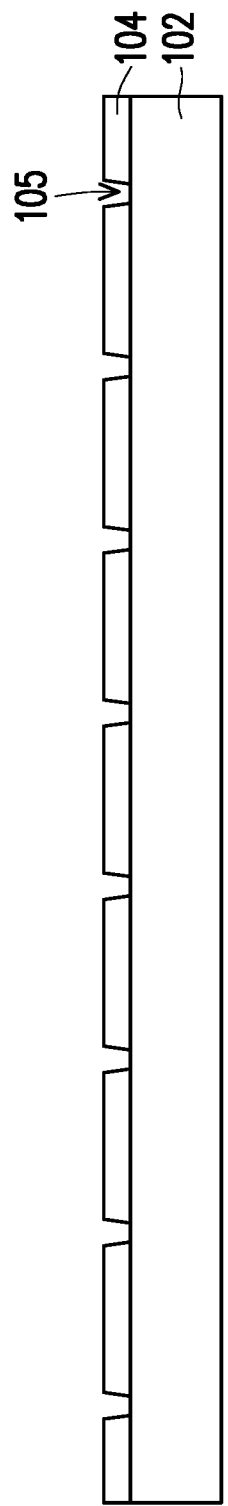
FIG. 1 to FIG. 12 are cross-sectional views of a method of forming a package structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 13:
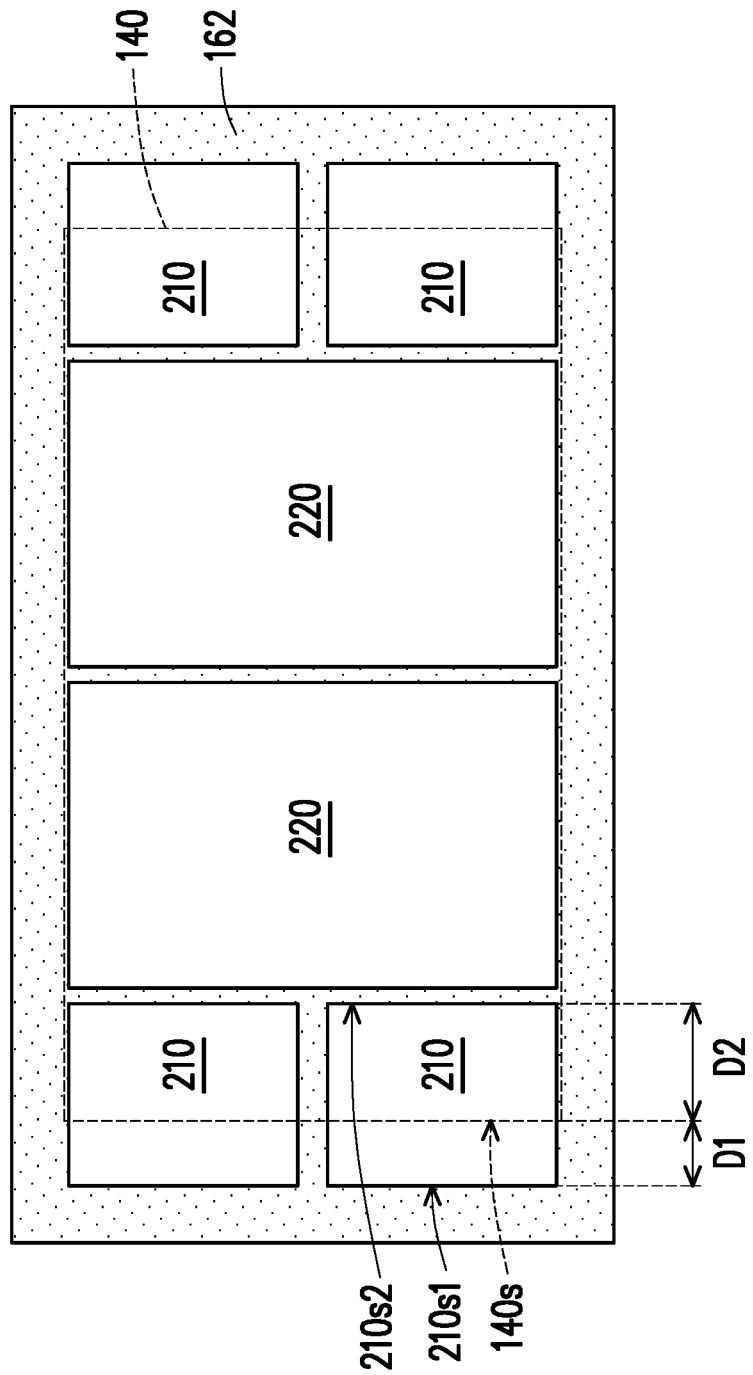
FIG. 13 is a top view of FIG. 9 in accordance with some embodiments.
Figure 14:
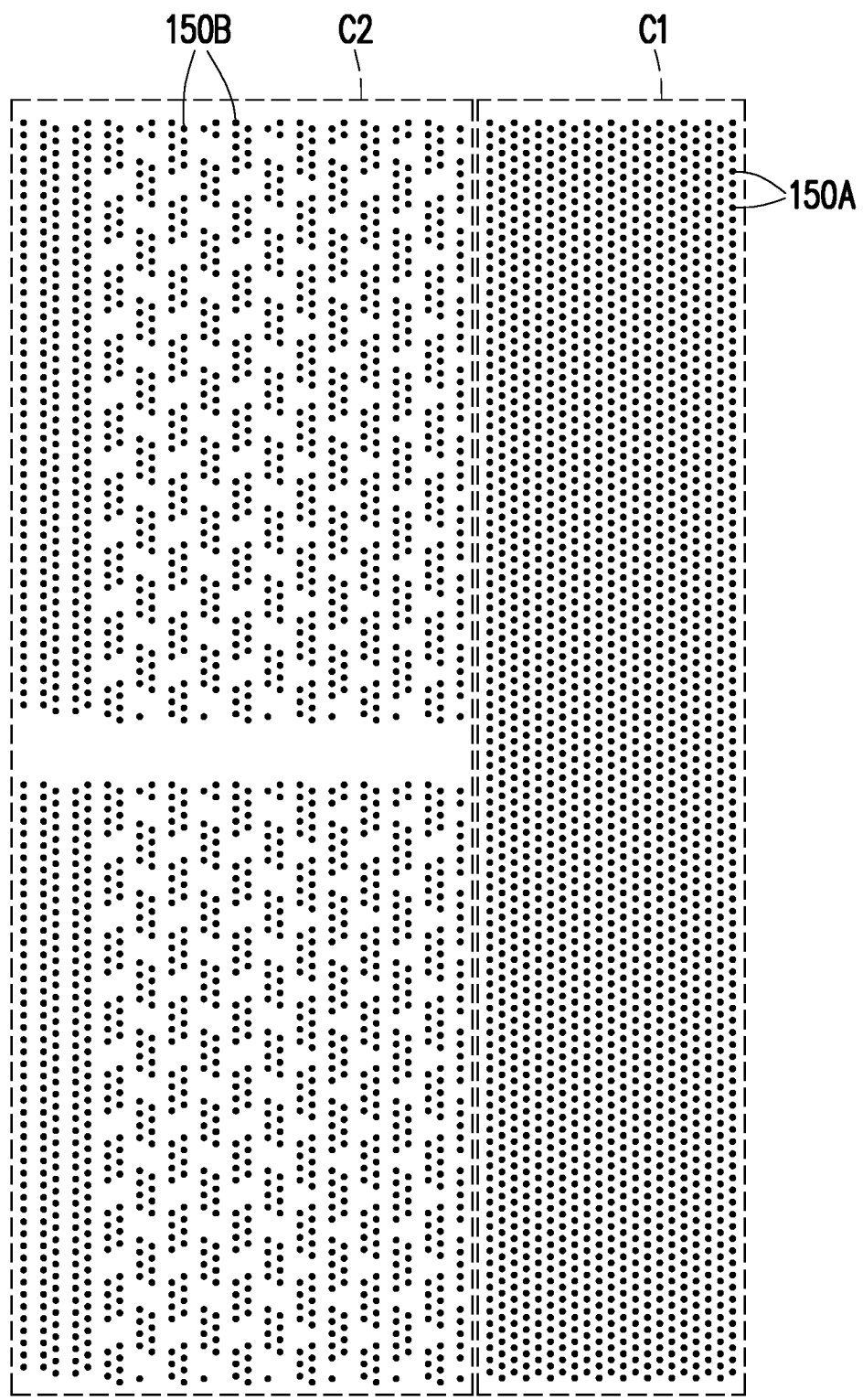
FIG. 14 is a top view of a distribution of the connectors of FIG. 9 in accordance with some embodiments.

FIG. 1 to FIG. 12 are cross-sectional views of a method of forming a package structure in accordance with some embodiments. FIG. 13 is a top view of FIG. 9 in accordance with some embodiments. FIG. 14 is a top view of a distribution of the connectors of FIG. 9 in accordance with some embodiments.

Referring to FIG. 1, a carrier 102 is provided. In some embodiments, the carrier 102 may be made of a material such as silicon, polymer, polymer composite, metal foil, ceramic, glass, glass epoxy, beryllium oxide, tape, or other suitable material for structural support. In the embodiment, the carrier 102 is a glass substrate.

In FIG. 1 to FIG. 4, a redistribution layer (RDL) structure 110 (not fully illustrated in FIG. 1 but fully illustrated below with respect to FIG. 4) may be formed on the carrier 102. In the embodiment shown, the RDL structure 110 includes a dielectric layer 104, a metallization pattern 106 (sometimes referred to as redistribution layers or redistribution lines) including conductive vias extending through the dielectric layer 104, one or more dielectric layers 114, one or more metallization patterns 116, one or more dielectric layers 124, one or more metallization patterns 126. More or fewer dielectric layers and metallization patterns, such as two to five dielectric layers and one to four metallization patterns, may be formed in the RDL structure 110. If fewer dielectric layers and metallization patterns are to be formed, steps and process discussed below may be omitted. If more dielectric layers and metallization patterns are to be formed, steps and processes discussed below may be repeated.

Referring now to FIG. 1, the dielectric layer 104 is deposited on the carrier 102. In some embodiments, the dielectric layer 104 is formed of a photo-sensitive material, such as polybenzoxazole (PBO), polyimide (PI), benzocyclobutene (BCB), or the like, or a combination thereof, which may be patterned using a lithography mask. The dielectric layer 104 may be formed by spin coating, lamination, CVD, the like, or a combination thereof. The dielectric layer 104 is then patterned. The patterning forms openings 105 exposing portions of the carrier 102. The patterning may be by an acceptable process, such as by exposing and developing the dielectric layer 104 to light when the dielectric layer 104 is a photo-sensitive material or by etching using, for example, an anisotropic etch.

Figure 2:
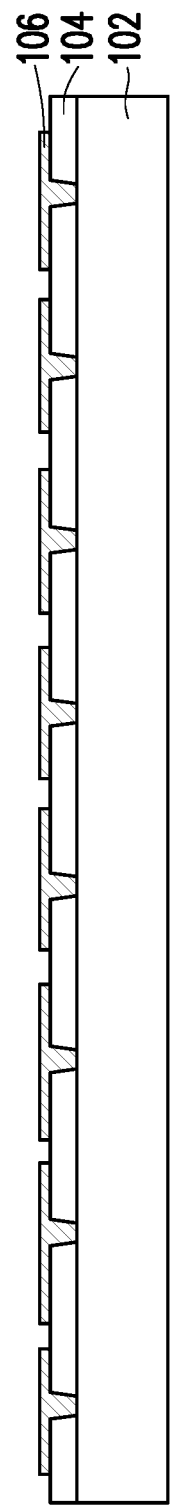

Referring now to FIG. 2, the metallization pattern 106 is then formed. The metallization pattern 106 includes conductive elements extending along the major surface of the dielectric layer 104 and extending through the dielectric layer 104 to contact the carrier 102. As an example to form the metallization pattern 106, a seed layer is formed over the dielectric layer 104 and in the openings extending through the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 106. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 106. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 3:
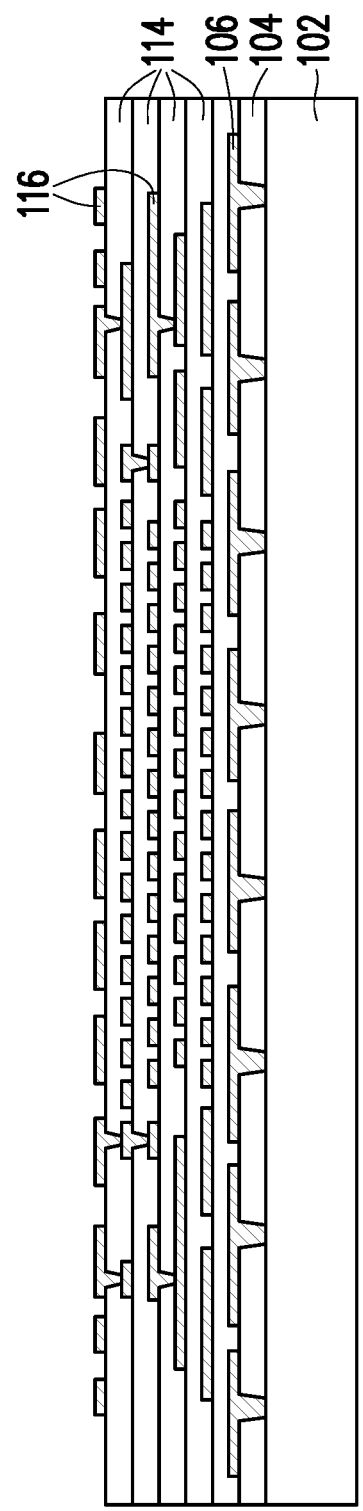

Referring now to FIG. 3, one or more dielectric layers 114 are deposited on the metallization pattern 106 and the dielectric layer 104. The dielectric layers 114 may be formed in a manner similar to the dielectric layer 104, and may be formed of a similar material as the dielectric layer 104.

One or more metallization patterns 116 are then formed. The metallization patterns 116 may include portions on and extending along the major surface of the dielectric layer 104. The metallization patterns 116 further include portions extending through the dielectric layer 104 to physically and electrically couple the metallization pattern 106. The metallization patterns 116 may be formed in a similar manner and of a similar material as the metallization pattern 106. In some embodiments, the metallization patterns 116 have a different size than the metallization pattern 106. For example, the conductive lines and/or vias of the overlying metallization patterns 116 may be wider or thicker than the conductive lines and/or vias of the underlying metallization pattern 106. Further, the overlying metallization patterns 116 may be formed to a greater pitch than the underlying metallization pattern 106.

Figure 4:
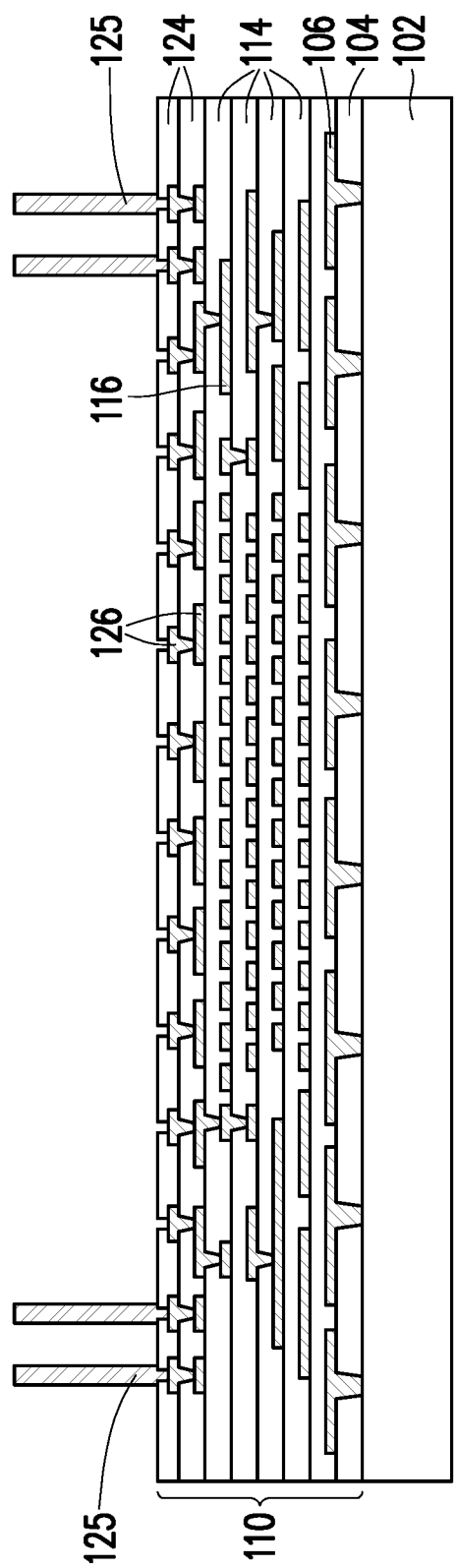

Referring now to FIG. 4, one or more dielectric layers 124 are deposited on the metallization patterns 116 and the dielectric layers 114. The dielectric layers 124 may be formed in a manner similar to the dielectric layers 114, and may be formed of a similar material as the dielectric layers 114.

One or more metallization patterns 126 are then formed to accomplishing the RDL structure 110. In some embodiments, the RDL structure 110 may be referred to as an interposer, such as an organic interposer. The metallization patterns 126 may include portions on and extending along the major surface of the dielectric layers 114. The metallization patterns 126 further include portions extending through the dielectric layers 114 to physically and electrically couple the metallization patterns 116. The metallization patterns 126 may be formed in a similar manner and of a similar material as the metallization patterns 116. In some embodiments, the metallization patterns 126 have a different size than the metallization patterns 116. For example, the conductive lines and/or vias of the overlying metallization patterns 126 may be wider or thicker than the conductive lines and/or vias of the underlying metallization patterns 116. Further, the overlying metallization patterns 126 may be formed to a greater pitch than the underlying metallization patterns 116.

As shown in FIG. 4, a plurality of through insulating vias (TIVs) 125 are formed on the RDL structure 110 and extending away from the topmost dielectric layer of the RDL structure 110 (e.g., the dielectric layers 124). As an example to form the TIVs 125, a seed layer (not shown) is formed over the RDL structure 110, e.g., on the dielectric layers 124 and portions of the metallization patterns 126 exposed by the openings (not shown). In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the TIVs 125.

Figure 5:
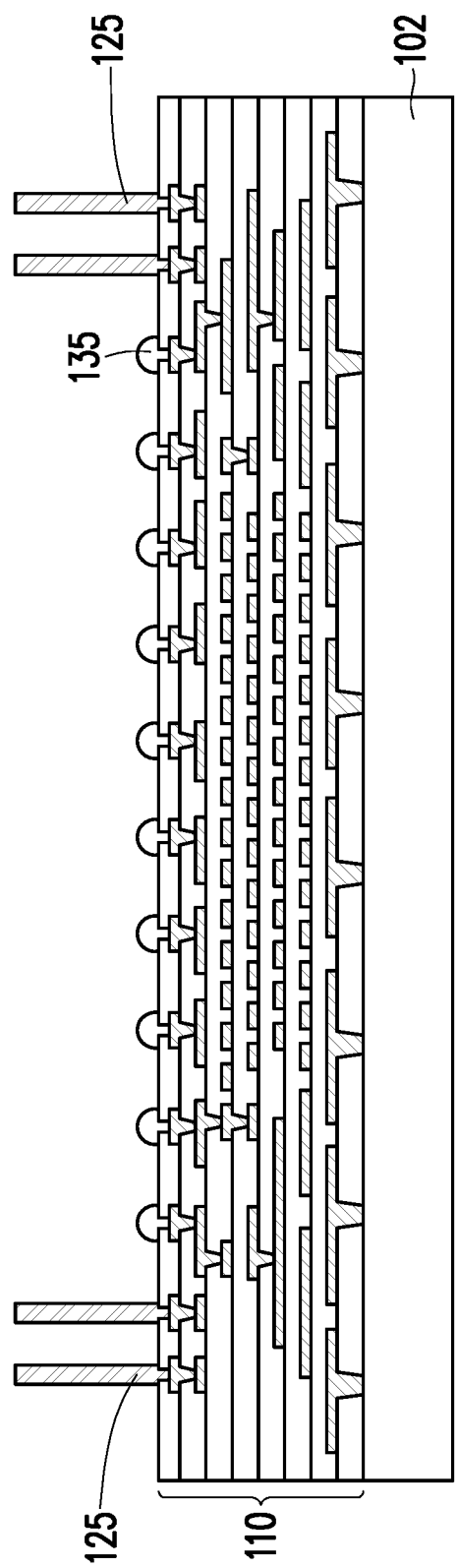

Referring to FIG. 5, a plurality of solder regions 135 are formed on the RDL structure 110. In some embodiments, the plurality of solder regions 135 are disposed between the TIVs 125. In some embodiments, the solder regions 135 may be solder balls, metal pillars, controlled collapse chip connection (C4) bumps, micro bumps, electroless nickel-electroless palladium-immersion gold technique (ENEPIG) formed bumps, or the like. The solder regions 135 may include a conductive material such as solder, copper, aluminum, gold, nickel, silver, palladium, tin, the like, or a combination thereof. In some embodiments, the solder regions 135 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the solder regions 135 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 6:
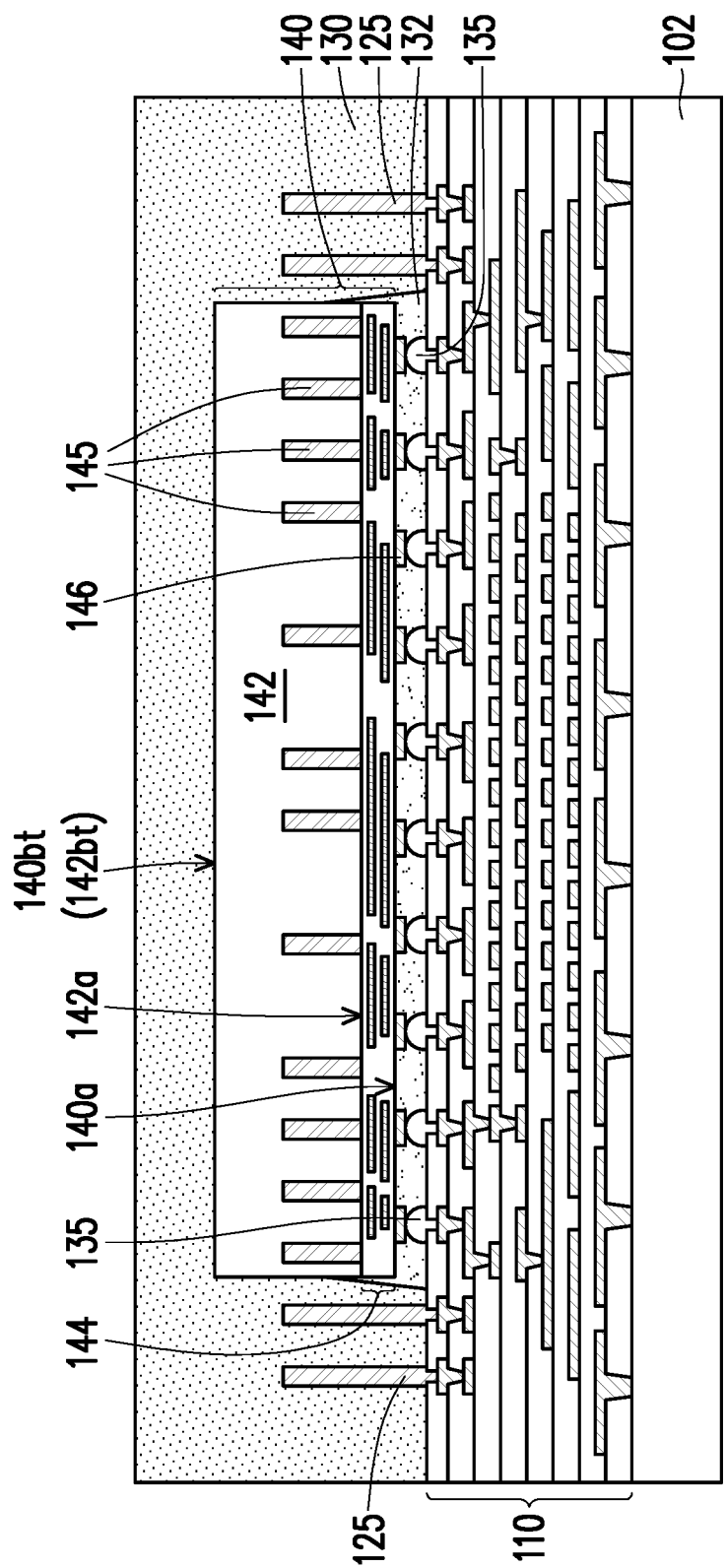

Referring to FIG. 6, a bottom die 140 is flipped and bonded onto the RDL structure 110. In some embodiments, the bottom die 140 has a front side (or active surface) 140a and a backside (or back surface) 140b opposite to each other.

The front side 140a of the bottom die 140 faces toward the RDL structure 110, and the backside 140b of the bottom die 140 faces upward.

In some embodiments, the bottom die 140 includes a system on chip (SoC) die including several different integrated circuits, i.e. ICs or processors, together with memories and I/O interfaces. Each of the integrated circuit integrates various components of a computer or other electronic systems into one semiconductor chip. The various components contain digital, analog, mixed-signal, and often radio-frequency functions. Also, the SoC integrates processors (or controllers) with advanced peripherals like a graphics processing unit (GPU), a Wi-Fi module, or a co-processor. In the architecture of the SoC, both logic components and memory components are fabricated in the same silicon wafer. For high efficiency computing or mobile devices, multi-core processors are used, and the multi-core processors includes large amounts of memories, such as several gigabytes. In some alternative embodiments, the bottom die 140 may be application-specific integrated circuit (ASIC) dies. In some other embodiments, the bottom die 140 are logic dies.

In detail, the bottom die 140 may include a substrate 142, an interconnect structure 144, a plurality of through substrate vias 145, and a plurality of conductive pads 146. In some embodiments, the substrate 142 may be made of silicon or other semiconductor materials. For example, the substrate 142 may be a silicon bulk substrate. Alternatively, or additionally, the substrate 142 may include other elementary semiconductor materials such as germanium. In some embodiments, the substrate 142 is made of a compound semiconductor such as silicon carbide, gallium arsenic, indium arsenide or indium phosphide. In some embodiments, the substrate 142 is made of an alloy semiconductor such as silicon germanium, silicon germanium carbide, gallium arsenic phosphide, or gallium indium phosphide. Furthermore, the substrate 142 may be a semiconductor on insulator such as silicon on insulator (SOI) or silicon on sapphire.

In some embodiments, the substrate 142 includes electrical components (not shown), such as resistors, capacitors, signal distribution circuitry, circuitry designed to achieve specific functions (e.g., signal processing functions or logic functions), combinations of these, or the like. These electrical components may be active, passive, or a combination thereof. In other embodiments, the substrate 142 is free from both active and passive electrical components therein. Such combinations are intended to be included within the scope of this disclosure.

The TSVs 145 extend from the first surface 142a of the substrate 142 toward, but do not reach, a second surface 142b of the substrate 142. In a subsequent substrate thinning process, the substrate 142 is thinned from the second surface 142b, such that the TSVs 145 are exposed at the second surface 142b (e.g., extends through the substrate 142). The TSVs 145 may be formed of a suitable electrically conductive material such as copper, tungsten, aluminum, alloys, combinations thereof, and the like. A barrier layer (not shown) may be formed between the TSVs 145 and the substrate 142. The barrier layer may include a suitable electrically conductive material such as titanium nitride, although other materials, such as tantalum nitride, titanium, or the like, may alternatively be utilized. In some embodiments, the barrier layer is formed of a dielectric material, such as $SiO_2$ or SiN.

As shown in FIG. 6, the interconnect structure 144 is formed on the substrate 142. In some embodiments, the interconnect structure 144 includes electrically conductive features, such as one or more layers of conductive lines and vias formed in a dielectric material, and is formed by a back-end-of-line (BEOL) process. For simplicity, the electrically conductive features and the dielectric material of the interconnect structure 144 are not labeled individually in FIG. 6. The interconnect structure 144 provides electrical connections among the TSVs 125 and the RDL structure 110, in some embodiments.

In some embodiments, the said dielectric material of the interconnect structure 144 includes an inner-layer dielectric (ILD) layer and at least one inter-metal dielectric (IMD) layer over the ILD layer. In some embodiments, the said dielectric material of the interconnect structure 144 includes silicon oxide, silicon nitride, silicon oxynitride, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, benzocyclobutene (BCB), SiLK™ (Dow Chemical, Midland, Mich.), polyimide, other low-k dielectric material, or combinations thereof. In some alternatively embodiments, the said dielectric material of the interconnect structure 144 may be a single layer or multiple layers. In some embodiments, the said conductive features of the interconnect structure 144 include plugs and metal lines. The plugs may include contacts formed in the ILD layer, and vias formed in the IMD layer. The contacts are formed between and in connect with the electrical components and a bottom metal line. The vias are formed between and in connect with two metal lines. The said conductive features of the interconnect structure 144 may be made of tungsten (W), copper (Cu), copper alloys, aluminum (Al), aluminum alloys, or a combination thereof. In some alternatively embodiments, a barrier layer (not shown) may be formed between the said conductive features and the said dielectric material. A material of the barrier layer includes tantalum, tantalum nitride, titanium, titanium nitride, cobalt-tungsten (CoW) or a combination thereof, for example.

The conductive pads 146 are formed on and electrically coupled to the electrically conductive features of the interconnect structure 144. In some embodiments, the conductive pads 146 respectively correspond to and contact with the solder regions 135, as shown in FIG. 6. The conductive pads 146 may be of any suitable type, such as microbumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like.

After bonding the bottom die 140 onto the RDL structure by the solder regions 135 and the conductive pads 146, an underfill 132 is formed to laterally surround the solder regions 135 and the conductive pads 146, as shown in FIG. 6. In addition, the underfill 132 further covers a portion of the sidewall of the bottom die 140. In some embodiments, the underfill 132 may be any acceptable material, such as a polymer, epoxy, molding underfill, or the like. The underfill 132 may be formed by a capillary flow process after the bottom die 140 is attached or may be formed by a suitable deposition method before the bottom die 140 is attached.

Next, the underfill 132 is cured using a curing process, in some embodiments. The curing process may include heating the underfill 132 to a predetermined temperature for a predetermined period of time, using an anneal process or other heating process. The curing process may also include an ultra-violet (UV) light exposure process, an infrared (IR) energy exposure process, combinations thereof, or a combination thereof with a heating process. Alternatively, the underfill 132 may be cured using other methods. In some embodiments, a curing process is not included.

After curing the underfill 132, an encapsulant 130 is then formed to laterally encapsulate the TIVs 125, the bottom die 140, and the underfill 132. In some embodiments, the encapsulant 130 may include an epoxy, an organic polymer, a polymer with or without a silica-based filler or glass filler added, or other materials, as examples. In some embodiments, the encapsulant 130 includes a liquid molding compound (LMC) that is a gel type liquid when applied. The encapsulant 130 may also include a liquid or solid when applied. Alternatively, the encapsulant 130 may include other insulating and/or encapsulating materials. The encapsulant 130 is applied using a wafer level molding process in some embodiments. The encapsulant 130 may be molded using, for example, compressive molding, transfer molding, molded underfill (MUF), or other methods. In some embodiments, the encapsulant 130 and the underfill 132 have different materials. In this case, an interface is formed between the encapsulant 130 and the underfill 132.

Next, the encapsulant 130 is cured using a curing process, in some embodiments. The curing process may include heating the encapsulant 130 to a predetermined temperature for a predetermined period of time, using an anneal process or other heating process. The curing process may also include an ultra-violet (UV) light exposure process, an infrared (IR) energy exposure process, combinations thereof, or a combination thereof with a heating process. Alternatively, the encapsulant 130 may be cured using other methods. In some embodiments, a curing process is not included.

Figure 7:
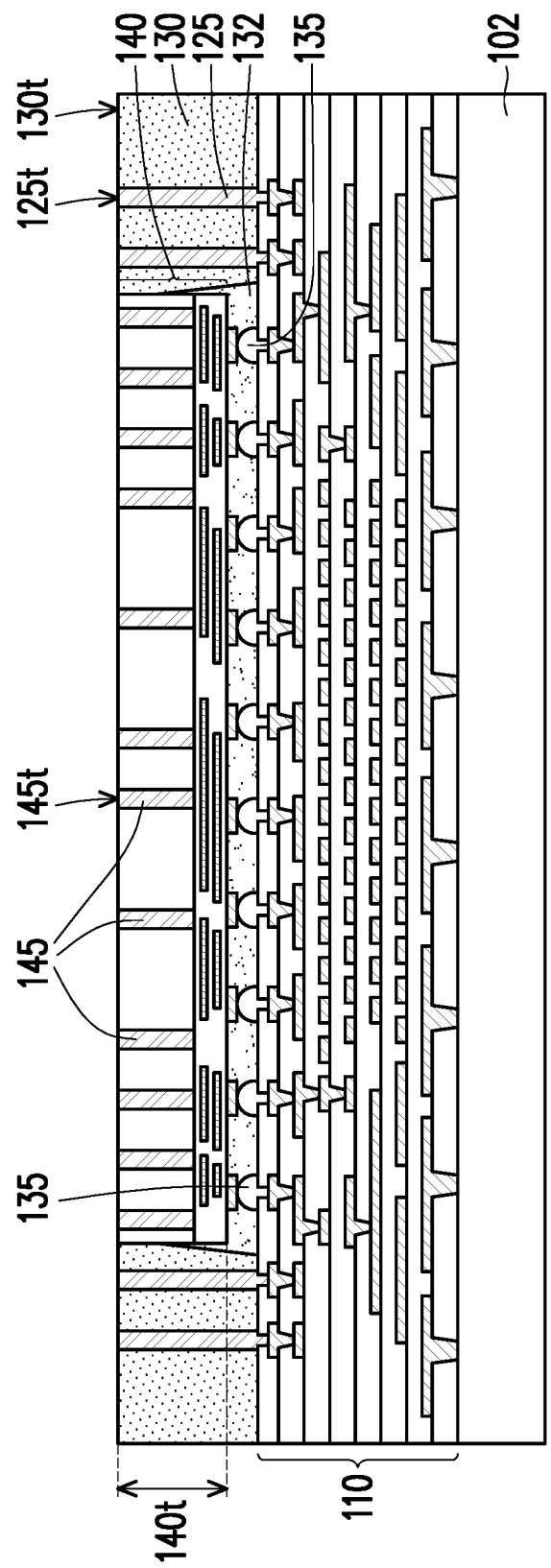

Referring to FIG. 7, a planarization process is performed on the encapsulant 130 to expose top surfaces 145t of the TSVs 145 and top surfaces 125t of the TIVs 125. In some embodiments, the planarization process includes a chemical mechanical polishing (CMP) process, and may be performed to remove excess portions of the encapsulant 130, such that the encapsulant 130, the TSVs 145, and TIVs 125 have a coplanar upper surface. That is, the top surfaces 145t of the TSVs 145, the top surfaces 125t of the TIVs 125, the top surface 130t of the encapsulant 130, and the backside 140bt of the bottom die 140 are substantially coplanar. After performing the planarization process, the bottom die 140 is thinned to a certain thickness 140t. In some embodiments, the thickness 140t of the bottom die 140 is less than 100 μm. In some alternative embodiments, the thickness 140t of the bottom die 140 is in a range of 20 μm to 100 μm, such as 20 μm, 30 μm, 40 μm, 50 μm, 60 μm, 70 μm, 80 μm, 90 μm, or 100 μm. It should be noted that the thin thickness of the bottom die 140 can effectively shorten the vertical transmission path between the bottom die 140 and a to-be-mounted overlying dies 210 (e.g., HBM dies), thereby achieving the effect of the fast talk or fast communication. However, when the thickness 140t of the bottom die 140 is too thin, it will cause the warpage issue and/or the bonding fail issue between the bottom die 140 and the RDL structure 110.

Figure 8:
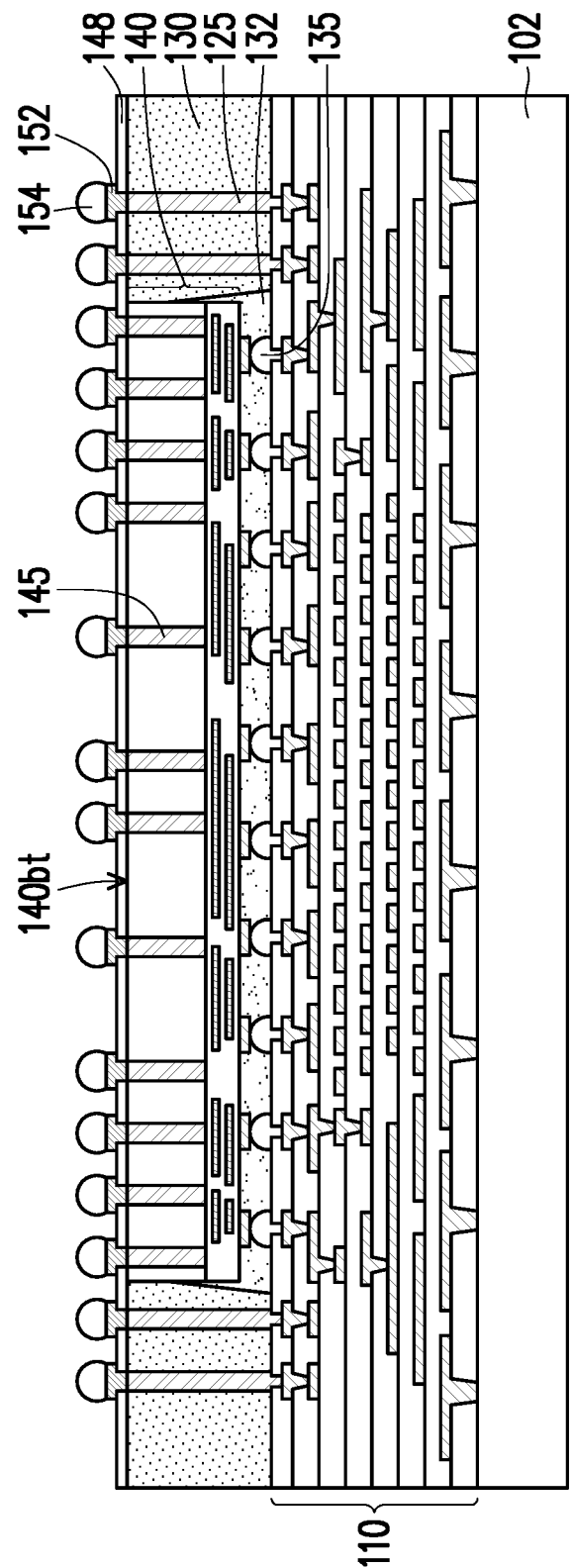

Referring to FIG. 8, a polymer layer 148 is formed on the encapsulant 130 and the backside 140bt of the bottom die 140. In some embodiments, the polymer layer 148 include a photo-sensitive material such as polybenzoxazole (PBO), polyimide (PI), benzocyclobutene (BCB), a combination thereof or the like.

Afterward, a plurality of bonding pads 152 are formed over the polymer layer 148. In the illustrated embodiment, the bonding pads 152 extend through the polymer layer 148, and are electrically coupled to the TIVs 125 and the TSVs 145. The bonding pads 152 may be, e.g., microbumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like. Solder regions 154 may be formed over the bonding pads 152, as illustrated in FIG. 8. In some embodiments, the solder regions 154 may be solder balls, metal pillars, controlled collapse chip connection (C4) bumps, micro bumps, electroless nickel-electroless palladium-immersion gold technique (ENEPIG) formed bumps, or the like. The solder regions 154 may include a conductive material such as solder, copper, aluminum, gold, nickel, silver, palladium, tin, the like, or a combination thereof.

Figure 9:
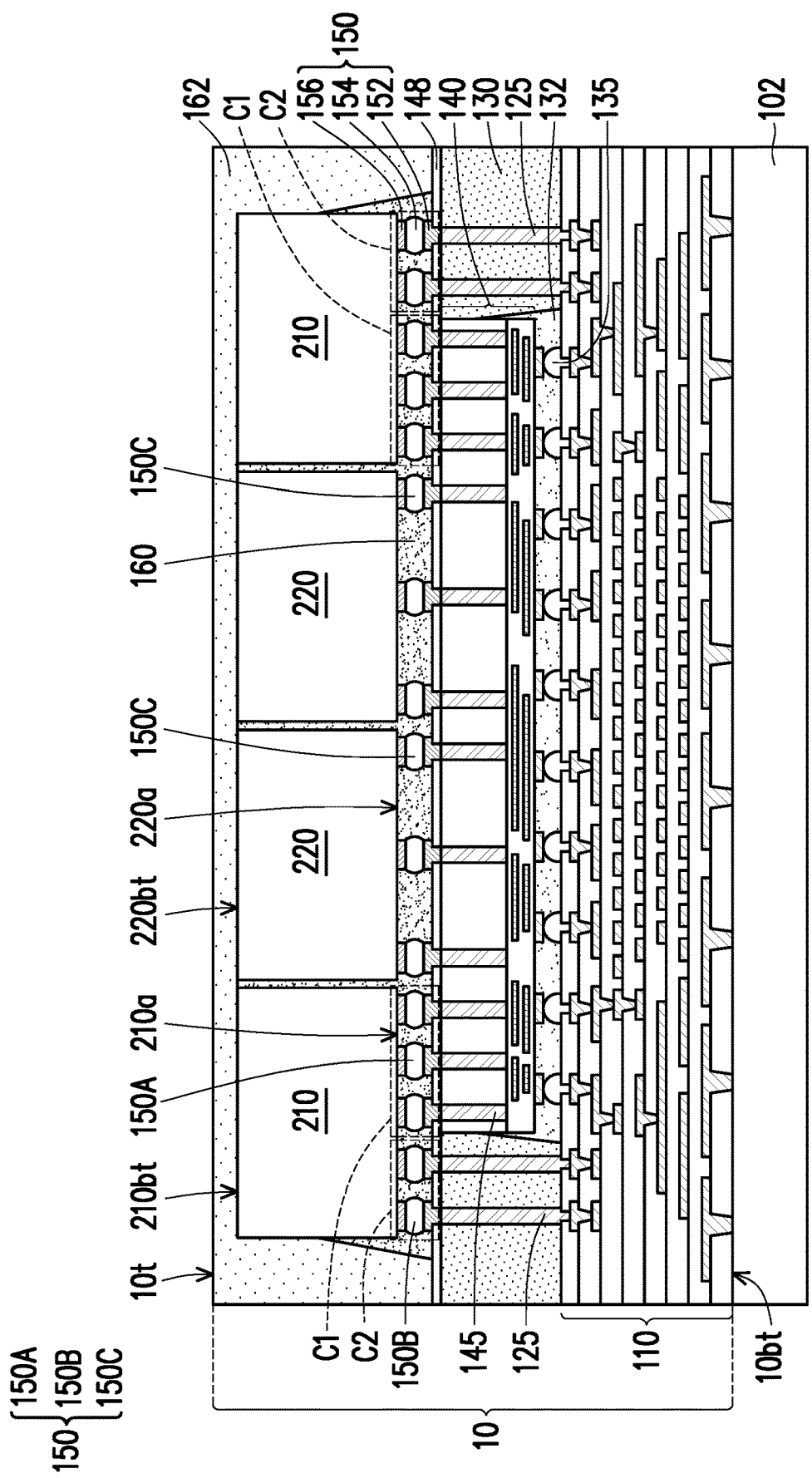

Referring to FIG. 8 to FIG. 9, a plurality of first dies 210 and a plurality of second dies 220 are flipped and bonded onto the backside 140bt of the bottom die 140 and the encapsulant 130. In detail, the first dies 210 and the second dies 220 are bonded onto the backside 140bt of the bottom die 140 by a plurality of conductive connectors 150. In some embodiments, the conductive connectors 150 may be solder balls, metal pillars, controlled collapse chip connection (C4) bumps, micro bumps, electroless nickel-electroless palladium-immersion gold technique (ENEPIG) formed bumps, or the like. In the illustrated embodiment, the conductive connectors 150 may be micro bumps which include the solder region 154 between the bonding pads 152 and 156. The conductive connectors 150 may include a conductive material such as solder, copper, aluminum, gold, nickel, silver, palladium, tin, the like, or a combination thereof. In some embodiments, the conductive connectors 150 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 150 include metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In some embodiments, the first dies 210 may be a memory device, such as a hybrid memory cube (HMC) module, a high bandwidth memory (HBM) module, or the like that includes multiple memory dies. In such embodiments, the first dies 210 have a front side 210a and a backside 210b opposite to each other. The front side 210a of the first dies 210 faces toward the backside 140bt of the bottom die 140, while the backside 210b of the first dies 210 faces upward.

In some embodiments, the second dies 220 may include static random access memory (SRAM) dies, system on chip (SoC) dies, dummy dies, chip scale packages (CSP), or a combination thereof. That is, the second dies 220 and the first dies 210 may have different functions. For example, the second dies 220 are SoC dies, and the first dies 210 are HBM dies. As shown in FIG. 9, the second dies 220 have a front side 220a and a backside 220b opposite to each other. The front side 220a of the second dies 220 faces toward the backside 140bt of the bottom die 140, while the backside 220b of the second dies 220 faces upward.

After bonding the first dies 210 and the second dies 220, an underfill 160 is then formed to laterally encapsulant the conductive connectors 150. In some embodiments, the underfill 160 may be any acceptable material, such as a polymer, epoxy, molding underfill, or the like. The underfill 160 may be formed by a capillary flow process after the first dies 210 and the second dies 220 are attached or may be formed by a suitable deposition method before the first dies 210 and the second dies 220 are attached.

Next, the underfill 160 is cured using a curing process, in some embodiments. The curing process may include heating the underfill 160 to a predetermined temperature for a predetermined period of time, using an anneal process or other heating process. The curing process may also include an ultra-violet (UV) light exposure process, an infrared (IR) energy exposure process, combinations thereof, or a combination thereof with a heating process. Alternatively, the underfill 160 may be cured using other methods. In some embodiments, a curing process is not included.

After curing the underfill 160, an encapsulant 162 is then formed to laterally encapsulate the first dies 210, the second dies 220, and the underfill 160. In some embodiments, the encapsulant 162 may include an epoxy, an organic polymer, a polymer with or without a silica-based filler or glass filler added, or other materials, as examples. In some embodiments, the encapsulant 162 includes a liquid molding compound (LMC) that is a gel type liquid when applied. The encapsulant 162 may also include a liquid or solid when applied. Alternatively, the encapsulant 162 may include other insulating and/or encapsulating materials. The encapsulant 162 is applied using a wafer level molding process in some embodiments. The encapsulant 162 may be molded using, for example, compressive molding, transfer molding, molded underfill (MUF), or other methods. In some embodiments, the encapsulant 162 and the underfill 160 have different materials. In this case, an interface is formed between the encapsulant 162 and the underfill 160.

Next, the encapsulant 162 is cured using a curing process, in some embodiments. The curing process may include heating the encapsulant 162 to a predetermined temperature for a predetermined period of time, using an anneal process or other heating process. The curing process may also include an ultra-violet (UV) light exposure process, an infrared (IR) energy exposure process, combinations thereof, or a combination thereof with a heating process. Alternatively, the encapsulant 162 may be cured using other methods. In some embodiments, a curing process is not included.

In the top view of FIG. 13, two second dies 220 are disposed between four first dies 210. However, the embodiments of the present disclosure are not limited thereto. In other embodiments, the number and the arrangement of the first dies 210 and the second dies 220 may be adjusted by the needs. For example, single second die may be disposed between two first dies. In addition, the bottom die 140 is disposed below the first dies 210 and the second dies 220. In some embodiments, the bottom die 140 is completely overlapped with the second dies 220, and the bottom die 140 is partially overlapped with the first dies 210. It should be noted that a sidewall 140s of the bottom die 140 is located between an outer sidewall 210s1 and an inner sidewall 210s2 of the first dies 210, and the outer sidewall 210s1 of the first dies 210 is closer to the sidewall 140s of the bottom die 140 than the inner sidewall 210s2 of the first dies 210. That is, a distance D1 between the outer sidewall 210s1 of the first dies 210 and the sidewall 140s of the bottom die 140 is less than a distance D2 between the inner sidewall 210s2 of the first dies 210 and the sidewall 140s of the bottom die 140.

Take the bottom die 140 is a SOC die and the first dies are HBM dies as an example, the signal input/output (I/O) of the HBM dies 210 is mainly concentrated near the inner sidewall 210s2 of the HBM dies 210. That is, the HBM dies 210 are electrically connected to the SoC die 140 by a plurality of first connectors 150A (as shown in FIG. 9) to form a signal path. On the other hand, the HBM dies 210 are electrically connected to the RDL structure 110 by a plurality of second connectors 150B (as shown in FIG. 9) to form a power path. In some embodiments, the first connectors 150A are located within a region C1 between the HBM dies 210 and the SoC die 140, and the second connectors 150B within a region C2 between the HBM dies 210 and the TIVs 125, as shown in FIG. 9. The first connectors 150A may be closer to the second dies 220 than the second connectors 150B. That is, the first connectors 150A may be closer to the middle of the SoC die 140 than the second connectors 150B. Therefore, the extending area of the SoC die 140 (shown in FIG. 13) from the inner sidewall 210s2 to the outer sidewall 210s1 of the HBM dies 210 is larger, more first connectors 150A may be disposed within the region C1 (shown in FIG. 14). In this case, the number of the signal transmission terminals between the SoC die 140 and the HBM dies 210 is increased, thereby improving the signal transmission speed between the bottom die 140 and the first dies 210. Further, in the top view of FIG. 14, the first connectors 150A have a pattern density greater than a pattern density of the second connectors 150B, in some embodiments. In other word, the first connectors 150A may have a pitch less than a pitch of the second connectors 150B. Herein, the term "pitch" is referred to a distance between two adjacent connectors 150A or 150B.

It should be noted that the first connectors 150A may be used to directly connect or couple the HBM dies 210 and the SoC die 140. Compared with the conventional RDL structure, the first connectors 150A provide a vertical signal path to reduce the signal transmission path, thereby improving the signal transmission speed between the HBM dies 210 and the SoC die 140. In addition, the thin SoC die 140 (e.g., less than 100 μm) can effectively shorten the vertical signal path between the SoC die 140 and the HBM dies 210, thereby achieving the effect of the fast talk or fast communication. In such embodiment, the region C1 having the first connectors 150A may be referred to as a signal transmission region, and the first connectors 150A may be referred to as signal connectors. Further, the HBM dies 210 are electrically connected to the RDL structure 110 by the second connectors 150B and the TIVs 125 to form the power path. In such embodiment, the region C2 having the second connectors 150B may be referred to as a power transmission region, and the second connectors 150B may be referred to as power connectors.

Moreover, the conductive connectors 150 further include a plurality of third connectors 150C between the second dies 220 and the SoC die 140. In such embodiment, the third connectors 150C thermally couples the second dies 220 and the SoC die 140 to dissipate the heat from the SoC die 140. That is, the second dies 220 may be referred to as heat spreaders in the package structure. On the other hand, the second dies 220 may be electrically coupled to the SoC die 140 by the third connectors 150C and the TSVs 145. It should be noted that the vertical transmission path formed by the third connectors 150C and the TSVs 145 can effectively improve the signal transmission speed between the bottom die 140 and the second dies 220.

Figure 10:
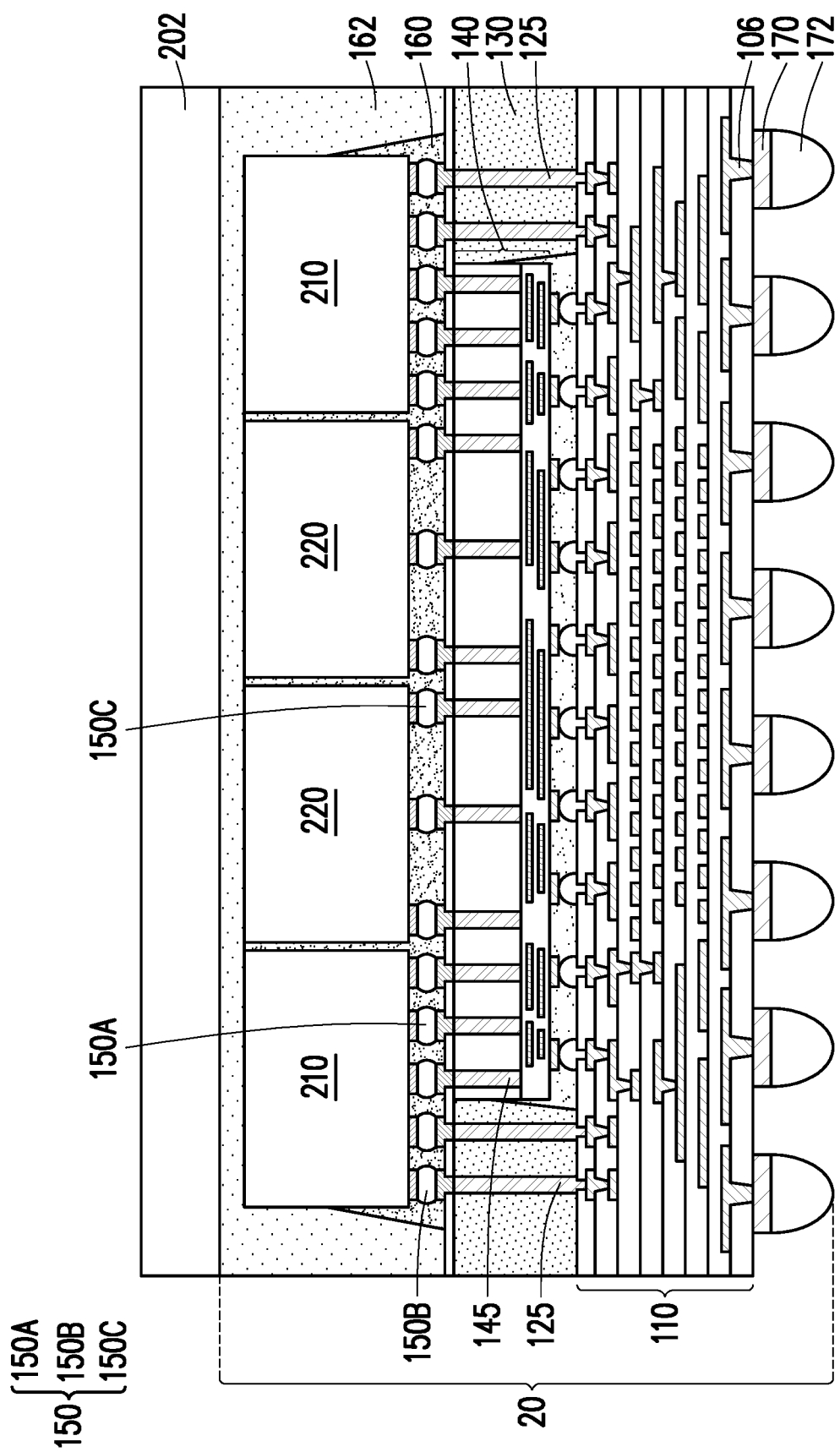

Referring to FIG. 9 to FIG. 10, a carrier swap is then performed, so that an overlying structure 10 illustrated in FIG. 9 is attached onto a carrier 202. In some embodiments, the overlying structure 10 may be attached onto the carrier 202, e.g., through an adhesive layer (not shown). The adhesive layer may be photosensitive and may be easily detached from the carrier 202 by shining, e.g., an ultra-violet (UV) light on the carrier 202 in a subsequent carrier de-bonding process. For example, the adhesive layer may be a light-to-heat-conversion (LTHC) coating. Next, the carrier 102 is removed to expose the metallization pattern 106 of the RDL structure 110. In some embodiments the carrier 102 is removed by a carrier de-bonding process. The carrier de-bonding process may remove the carrier 102 using any suitable process, such as etching, grinding, and mechanical peel off.

After swapping the carrier, a plurality of under ball metals (UBMs) 170 are formed for external connection to the RDL structure 110. The UBMs 170 may have bump portions on and extending along the bottom surface of the dielectric layer 104, and may have via portions extending through the dielectric layer 104 to physically and electrically couple the metallization pattern 106. As a result, the UBMs 170 are electrically coupled to the bottom die 140, the first dies 210, and the second dies 220 by the RDL structure 110 and the TIVs 125. The UBMs 170 may be formed of the same material as the metallization pattern 106.

Next, a plurality of conductive connectors 172 are formed on the UBMs 170. The conductive connectors 172 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 172 may include a conductive material such as solder, copper, aluminum, gold, nickel, silver, palladium, tin, the like, or a combination thereof. In some embodiments, the conductive connectors 172 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 172 include metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 11:
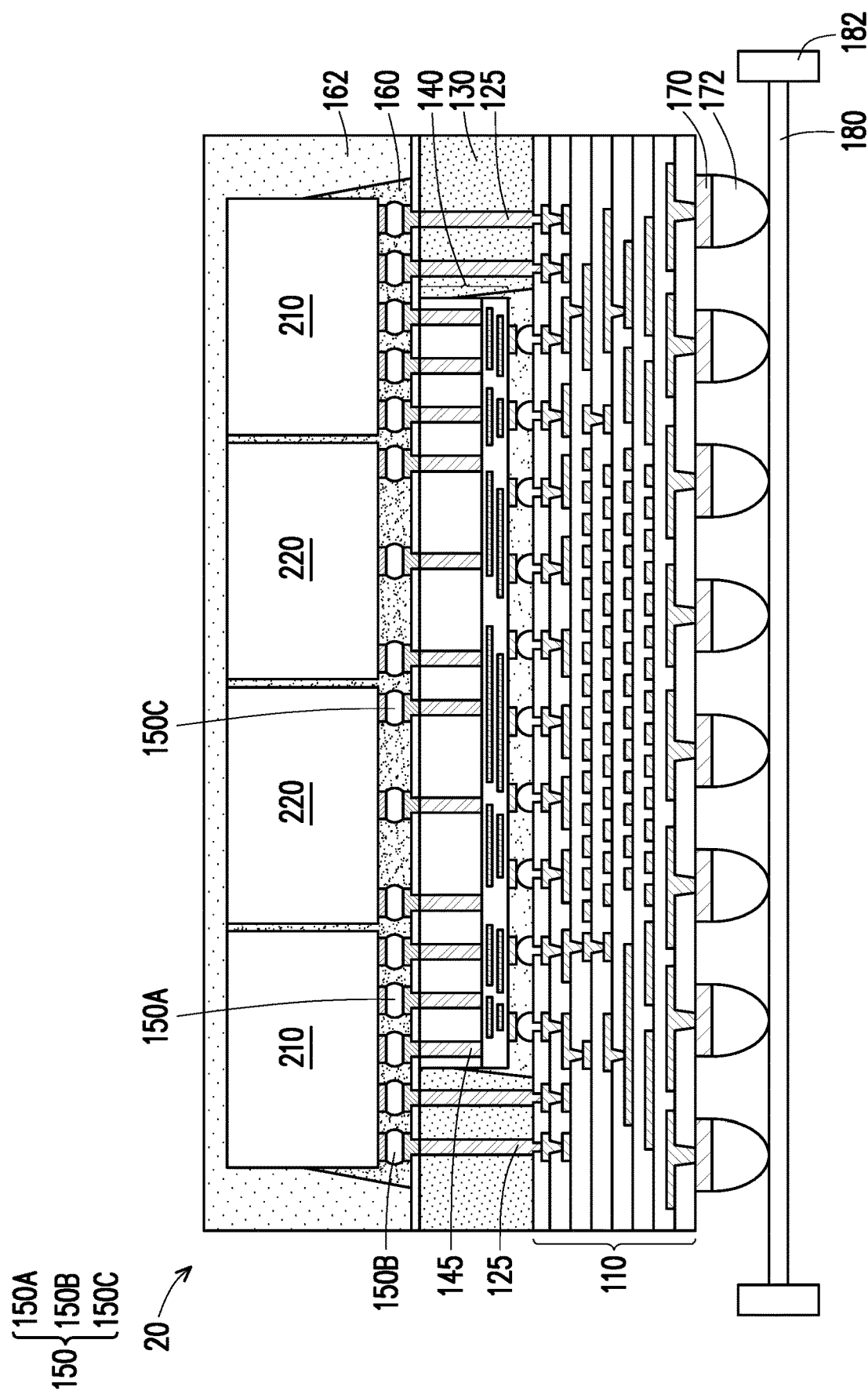

Referring to FIG. 10 and FIG. 11, a carrier de-bonding is performed to detach (or "de-bond") the carrier 202 from an overlying structure 20. In some embodiments, the de-bonding includes projecting a light such as a laser light or an UV light on the adhesive layer between the carrier 202 and the encapsulant 162, so that the adhesive layer decomposes under the heat of the light and the carrier 202 can be removed. Next, the overlying structure 20 is attached onto a tape 180 (e.g., a blue tape) supported by a frame 182 (e.g., a metal frame).

Figure 12:
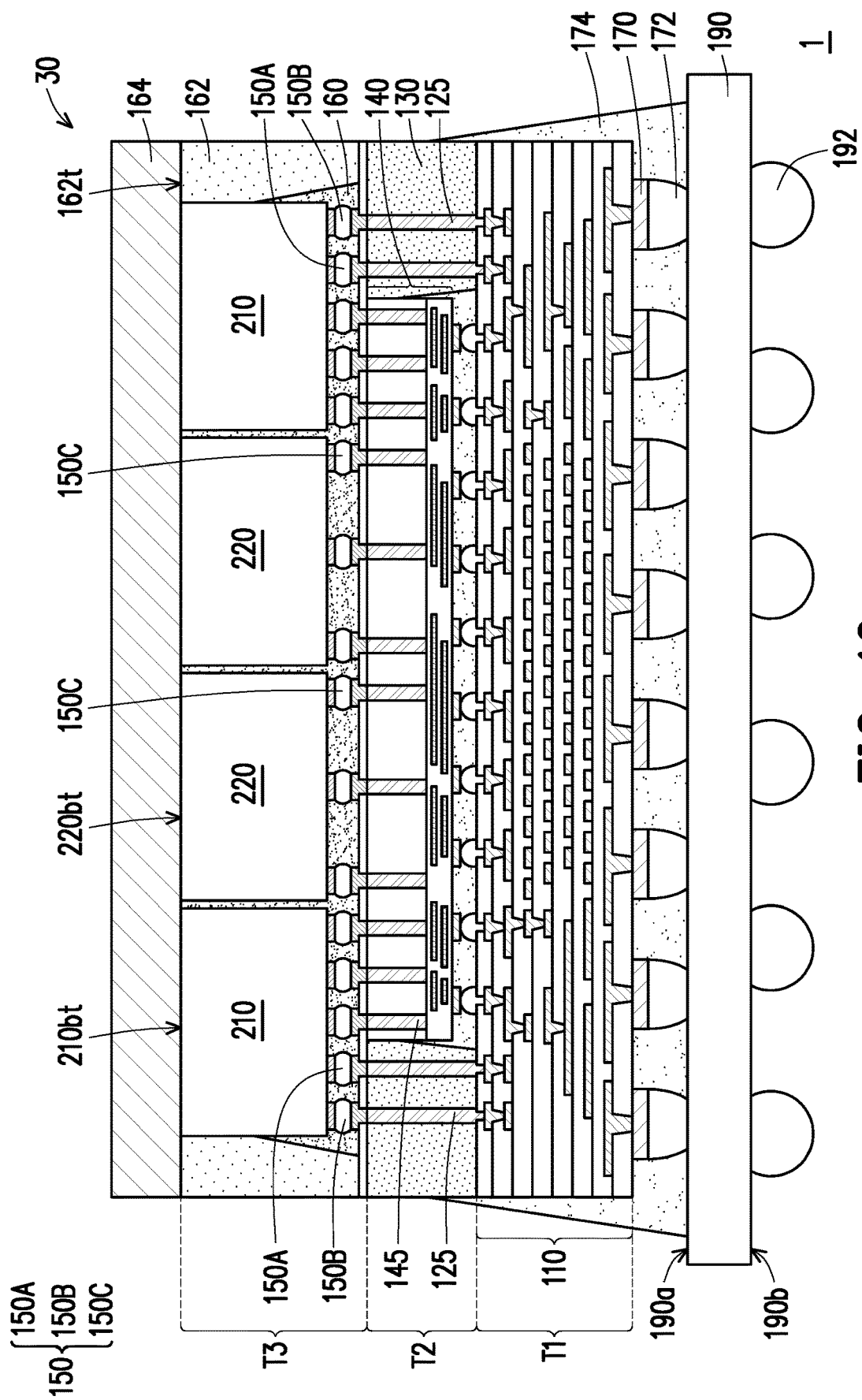

Referring to FIG. 11 to FIG. 12, the structure 20 may be bonded onto a package substrate 190, thereby accomplishing a package structure 1. In detail, a planarization process is performed on the encapsulant 162 to expose the backside 210$bt$ of the first dies 210 and the backside 220$bt$ of the second dies 220. The planarization process may also remove material of the first dies 210 and second dies 220. In this case, the backside 210$bt$ of the first dies 210, the backside 220$bt$ of the second dies 220, and the top surface 162$t$ of the encapsulant 162 are substantially coplanar. In some embodiments, the planarization process may be, for example, a CMP process, a grinding process, or the like. In some embodiments, the planarization may be omitted, for example, if the backside 210$bt$ of the first dies 210 and the backside 220$bt$ of the second dies 220 are already exposed by the encapsulant 162.

After performing the planarization process, a heat sink (or heat spreader) 164 is attached onto the backside 210$bt$ of the first dies 210 and the backside 220$bt$ of the second dies 220. In some embodiments, the bottom die 140 may trap heat to become hot spots in the package structure 1. Therefore, the second dies 220 thermally couples the bottom die 140 and the heat sink 164, so as to dissipate the heat from the bottom die 140 to the heat sink 164. In some alternative embodiments, a thermal interface material (TIM) may be formed between the second dies 220 and the heat sink 164.

The structure 30 may be bonded onto a first surface 190$a$ of a package substrate 190 by the conductive connectors 172. In some embodiments, the package substrate 190 includes one or more active devices and/or one or more passive devices (not shown) therein. A wide variety of devices such as transistors, capacitors, resistors, combinations of these, and the like may be used to provide structural and functional designs for the device stack. The devices may be formed using any suitable methods.

In some embodiments, the package substrate 190 includes a substrate core (not shown). The substrate core may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core may be an SOI substrate. Generally, an SOI substrate includes a layer of a semiconductor material such as epitaxial silicon, germanium, silicon germanium, SOI, SGOI, or combinations thereof. The substrate core is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core.

The package substrate 190 may also include metallization layers and vias (not shown) therein. The metallization layers may be formed over the active and passive devices in and/or on the substrate core, and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some alternative embodiments, the substrate core is substantially free of active and passive devices.

Afterward, a plurality of external terminals 192 are formed on a second surface 190b of the package substrate 190 that is opposite to the first surface 190a, thereby accomplishing the package structure 1. In some embodiments, the external terminals 192 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The external terminals 192 may include a conductive material such as solder, copper, aluminum, gold, nickel, silver, palladium, tin, the like, or a combination thereof. In some embodiments, the external terminals 192 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the external terminals 192 include metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In some embodiments, the package structure 1 includes a first tier T1, a second tier T2, and a third tier T3. The first tier T1 includes the RDL structure 110 (also referred to as an interposer). The second tier T2 is disposed on the first tier T1. The second tier T2 may include the bottom die 140, the encapsulant 130 laterally surrounding the bottom die 140, and the TIVs 125 penetrating through the encapsulant 130. The third tier T3 is disposed on the second tier T2, and the second tier T2 is disposed between the first tier T1 and the third tier T3. The third tier T3 may include the first dies 210 and the second dies 220. The second dies 220 are disposed between the first dies 210. The third tier T3 further includes the encapsulant 162 laterally surrounding the first dies 210 and the second dies 220. The first dies 210 are electrically connected to the bottom die 140 by the first connectors 150A to form the signal path, the first dies 210 are electrically connected to the RDL structure 110 by the second connectors 150B and the TIVs 125 to form the power path, and the first connectors 150A are closer to the second dies 220 than the second connectors 150B.

While FIGS. 1-12 are described with reference to a method, it will be appreciated that the structures shown in FIGS. 1-12 are not limited to the method but rather may stand alone separate of the method. While FIGS. 1-12 are described as a series of acts, it will be appreciated that the order of the acts may be altered in other embodiments. While FIGS. 1-12 illustrate and describe as a specific set of acts, some acts that are illustrated and/or described may be omitted in other embodiments. Further, acts that are not illustrated and/or described may be included in other embodiments.

In accordance with an embodiment, a package structure includes a first tier comprising an interposer; a second tier disposed on the first tier and comprising a bottom die; and a third tier disposed on the second tier and comprising a plurality of first dies and at least one second die, wherein the at least one second die is disposed between the plurality of first dies. The plurality of first dies are electrically connected to the bottom die by a plurality of first connectors to form a signal path, the plurality of first dies are electrically connected to the interposer by a plurality of second connectors to form a power path, and the plurality of first connectors are closer to the at least one second die than the plurality of second connectors.

In accordance with an embodiment, a method of forming a package structure includes: forming a redistribution layer (RDL) structure on a carrier; bonding a bottom die onto the RDL structure; forming a first encapsulant to laterally encapsulate the bottom die; forming a plurality of first connectors on a backside of the bottom die, and forming a plurality of second connectors on the first encapsulant; and bonding a plurality of first dies and at least one second die onto the bottom die by the plurality of first and second connectors, wherein the plurality of first dies are electrically connected to the bottom die by the plurality of first connectors to form a signal path, the plurality of first dies are electrically connected to the RDL structure by the plurality of second connectors to form a power path, and the plurality of first connectors are closer to the at least one second die than the plurality of second connectors.

In accordance with an embodiment, a package structure includes a bottom die; an encapsulant laterally encapsulating the bottom die; a plurality of through insulating vias (TIVs) penetrating through the encapsulant; and a plurality of high bandwidth memory (HBM) dies disposed on the bottom die and the encapsulant. The plurality of HBM dies are electrically connected to the bottom die by a plurality of first connectors to form a signal path, the plurality of HBM dies are electrically connected to the plurality of TIVs by a plurality of second connectors to form a power path, and the plurality of first connectors has a pattern density greater than a pattern density of the plurality of second connectors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a first tier comprising an interposer;
   a second tier disposed on the first tier and comprising a bottom die; and
   a third tier disposed on the second tier and comprising a plurality of first dies and at least one second die, wherein the at least one second die is disposed between the plurality of first dies,
   wherein the plurality of first dies are electrically connected to the bottom die by a plurality of first connectors to form a signal path, the plurality of first dies are electrically connected to the interposer by a plurality of second connectors to form a power path, and the plurality of first connectors are closer to the at least one second die than the plurality of second connectors.

2. The package structure of claim 1, wherein the bottom die is a system on chip (SoC) die.

3. The package structure of claim 1, wherein the plurality of first dies comprise high bandwidth memory (HBM) dies, and the at least one second die comprises a static random access memory (SRAM) die, a system on chip (SoC) die, a dummy die, a chip scale package (CSP), or a combination thereof.

4. The package structure of claim 1, wherein the bottom die is completely overlapped with the at least one second die, and the bottom die is partially overlapped with the plurality of first dies.

5. The package structure of claim 1, wherein a sidewall of the bottom die is located between an outer sidewall and an inner sidewall of the plurality of first dies, and the outer sidewall of the plurality of first dies is closer to the sidewall of the bottom die than the inner sidewall of the plurality of first dies.

6. The package structure of claim 1, wherein the interposer comprises a redistribution layer (RDL) structure.

7. The package structure of claim 1, wherein the plurality of first connectors has a pattern density greater than a pattern density of the plurality of second connectors.

8. The package structure of claim 1, wherein the bottom die comprises a plurality of through substrate vias (TSVs) to electrically connect the plurality of first connectors.

9. The package structure of claim 1, wherein the second tier further comprises:
- an encapsulant laterally encapsulating the bottom die; and
- a plurality of through insulating vias (TIVs) embedded in the encapsulant to surround the bottom die, wherein the plurality of TIVs is electrically connected the plurality of second connectors and the interposer.

10. A method of forming a package structure, comprising:
- forming a redistribution layer (RDL) structure on a carrier;
- bonding a bottom die onto the RDL structure;
- forming a first encapsulant to laterally encapsulate the bottom die;
- forming a plurality of first connectors on a backside of the bottom die, and forming a plurality of second connectors on the first encapsulant; and
- bonding a plurality of first dies and at least one second die onto the bottom die by the plurality of first and second connectors, wherein the plurality of first dies are electrically connected to the bottom die by the plurality of first connectors to form a signal path, the plurality of first dies are electrically connected to the RDL structure by the plurality of second connectors to form a power path, and the plurality of first connectors are closer to the at least one second die than the plurality of second connectors.

11. The method of claim 10, further comprising forming a plurality of through insulating vias (TIVs) in the first encapsulant to surround the bottom die, wherein the plurality of TIVs are electrically connected to the plurality of second connectors and the RDL structure.

12. The method of claim 10, wherein the bottom die comprises a plurality of through substrate vias (TSVs) to electrically connect the plurality of first connectors.

13. The method of claim 10, wherein the plurality of first connectors has a pattern density greater than a pattern density of the plurality of second connectors.

14. The method of claim 10, further comprising:
- forming a second encapsulant to laterally encapsulate the plurality of first dies and the at least one second die, wherein the second encapsulant exposes a backside of the plurality of first dies and a backside of the at least one second die; and
- attaching a heat sink on the backside of the plurality of first dies and the backside of the at least one second die.

15. The method of claim 10, wherein the bottom die is a system on chip (SoC) die.

16. The method of claim 15, wherein the plurality of first dies comprise high bandwidth memory (HBM) dies, and the at least one second die comprises a static random access memory (SRAM) die, a system on chip (SoC) die, a dummy die, a chip scale package (CSP), or a combination thereof.

17. A package structure, comprising:
- a bottom die;
- an encapsulant laterally encapsulating the bottom die;
- a plurality of through insulating vias (TIVs) penetrating through the encapsulant; and
- a plurality of high bandwidth memory (HBM) dies disposed on the bottom die and the encapsulant, wherein the plurality of HBM dies are electrically connected to the bottom die by a plurality of first connectors to form a signal path, the plurality of HBM dies are electrically connected to the plurality of TIVs by a plurality of second connectors to form a power path, and the plurality of first connectors has a pattern density greater than a pattern density of the plurality of second connectors.

18. The package structure of claim 17, further comprising at least one top die disposed on the bottom die and disposed between the plurality of HBM dies.

19. The package structure of claim 17, wherein the at least one top die and the plurality of HBM dies have different functions.

20. The package structure of claim 17, wherein a sidewall of the bottom die is located between an outer sidewall and an inner sidewall of the plurality of HBM dies, and the outer sidewall of the plurality of HBM dies is closer to the sidewall of the bottom die than the inner sidewall of the plurality of HBM dies.

* * * * *